(12) United States Patent
Jamin et al.

(10) Patent No.: US 12,417,365 B2
(45) Date of Patent: Sep. 16, 2025

(54) RADIO DEVICE WITH DC/DC CONVERTER AND PHASE CALIBRATION

(71) Applicant: NXP B.V., Eindhoven (NL)

(72) Inventors: Olivier Jérôme Célestin Jamin, Sainte Honorine du Fay (FR); Ludovic Oddoart, Opio (FR); Amandine Lesellier, Mondeville (FR); Fabien Boitard, Mouans Sartoux (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/493,883

(22) Filed: Oct. 25, 2023

(65) Prior Publication Data

US 2024/0176975 A1  May 30, 2024

(30) Foreign Application Priority Data

Nov. 25, 2022  (EP) .................................. 22306738

(51) Int. Cl.
| | |
|---|---|
| G06K 19/04 | (2006.01) |
| H02M 1/00 | (2006.01) |
| H02M 3/158 | (2006.01) |
| H03L 7/081 | (2006.01) |

(52) U.S. Cl.
CPC ........ G06K 19/045 (2013.01); H02M 1/0045 (2021.05); H02M 3/158 (2013.01); H03L 7/0814 (2013.01); H03L 7/0816 (2013.01)

(58) Field of Classification Search
CPC ........... G06K 19/045; G06K 16/06046; G06K 19/00; G06K 19/06; G06Q 20/34; G06Q 20/341; H02M 1/0045; H02M 3/158; H03L 7/0814; H03H 7/0816

USPC .................................. 235/449, 487, 488, 380
See application file for complete search history.

(56) References Cited

U.S. PATENT DOCUMENTS

| | | | |
|---|---|---|---|
| 8,963,527 | B2 | 2/2015 | Jing |
| 9,270,189 | B2* | 2/2016 | Rosado ............. H02M 3/33584 |
| 2008/0211578 | A1* | 9/2008 | Morishima ........... H02M 3/157 |
| | | | 341/143 |
| 2009/0051395 | A1* | 2/2009 | Goh ...................... H02M 3/156 |
| | | | 327/147 |
| 2013/0082536 | A1* | 4/2013 | Taylor ..................... H02J 50/12 |
| | | | 307/104 |
| 2013/0195496 | A1* | 8/2013 | Yamazawa ............... G05F 1/46 |
| | | | 399/88 |
| 2016/0172966 | A1 | 6/2016 | Kranz et al. |
| 2016/0196455 | A1* | 7/2016 | Gudan ..................... H04B 5/72 |
| | | | 340/10.5 |
| 2017/0126069 | A1* | 5/2017 | Martin ..................... H03K 7/08 |
| 2017/0180013 | A1 | 6/2017 | Kuttan et al. |

(Continued)

FOREIGN PATENT DOCUMENTS

| | | |
|---|---|---|
| DE | 102014014875 A1 | 3/2016 |
| EP | 2884642 A1 | 6/2015 |
| EP | 3280061 A1 | 2/2018 |

*Primary Examiner* — Edwyn Labaze (57) ABSTRACT

There is described a radio device comprising:
i) a receiver;
ii) a DC/DC converter;
iii) a clock device, configured to provide a synchronous clock to the receiver and the DC/DC converter; and
iv) a control device, configured to determine an information indicative of the DC/DC converter duty cycle, and to adjust the initial phase of the DC/DC converter clock and/or the receiver clock based on said information.

19 Claims, 8 Drawing Sheets

(56) References Cited

U.S. PATENT DOCUMENTS

2020/0274448 A1\* 8/2020 Jing ........................ H02J 1/102
2024/0120838 A1\* 4/2024 Bertolini ............. H02M 1/0025

\* cited by examiner

-prior art-

RADIO DEVICE WITH DC/DC CONVERTER AND PHASE CALIBRATION

CROSS-REFERENCE TO RELATED APPLICATIONS

This application claims priority under 35 U.S.C. § 119 to European Patent Application No. 22306738.0, filed on Nov. 25, 2022, the contents of which are incorporated by reference herein.

TECHNICAL FIELD

The present disclosure relates to a radio device, in particular a Radio Frequency Identification (RFID) device and/or a Near Field Communication (NFC) device, with a receiver and a DC/DC converter. Additionally, the present disclosure relates to a method of operating the radio device. Further, the present disclosure relates to a method of using a duty cycle measurement. The disclosure may hence relate to the technical field of radio devices such as RFID and NFC communication applications.

TECHNICAL BACKGROUND

Radio devices are widely used to enable communication between electronic devices. A radio device comprises in general a transmitter and/or a receiver, a matching circuit, and an antenna. While transmitter/receiver are generally formed on a chip (integrated circuit), the matching circuit and the antenna may be realized out of said chip, for example as an antenna device.

A specific example of a radio device may be an RFIC device and/or an NFC device. These devices are used in a variety of applications including, for example, smartcards or smartphones, to establish radio communication with each other by touching them together or bringing them into close proximity, for example within a short distance such as a few meters of only to several centimeters. Applications include, among others, contactless transactions, data exchange, and simplified setup of more complex communications such as Wi-Fi or Bluetooth. Various other types of communication applications include those between an RFID device, such as an NFC-enabled mobile phone, and another RFID device such as an NFC chip, called a "tag". Some of the applications involving identification products such as smart cards and RFID tags are used in endeavors such as transport (e.g., ticketing, road tolling, baggage tagging), finance (e.g., debit and credit cards, electronic purse, merchant card), communications (e.g., SIM card for GSM phone), and tracking (e.g., access control, inventory management, asset tracking).

There are radio devices that comprise a direct current (DC) to DC converter, in particular coupled to a transmitter. A DC/DC converter may be an electronic circuit/device that converts a source of direct current from one voltage level to another, e.g. as a power converter. The DC/DC converter may hereby convert the DC voltage level (e.g. from the battery of a smartphone) to a higher voltage level (for example in case of a boost converter) or to a lower voltage level (e.g. in case of a buck converter). Especially in the technical field of RFID/NFC devices, due to restricted available space, the DC/DC converter may be arranged together with the transmitter/receiver in the same (integrated) circuit (single die).

However, the different order of magnitude between the power processed by a DC/DC converter and the received power in a radio receiver may lead to interferences and a degradation of the receiver performance. This issue may be exacerbated, when an integration of a DC-DC converter with a high-power transmitter operates at the same time as a radio receiver, which may be the case with NFC/RFID applications, e.g. transceivers and full-duplex radios.

For example, in case of an NFC reader device, e.g. embedded in a mobile phone, the DC/DC converter may need to supply a transmitter with up to 3 Watts in order to provide sufficient energy, in the form of a magnetic field, to (activate) a passive NFC tag, while the receiver of the reader device demodulates the week response from the same NFC tag (only few u V or tens of u V).

FIGS. 5a and 5b illustrate this issue for a conventional transceiver with an integrated pulse-width modulation (PWM) DC/DC converter, wherein the DC/DC converter and the transceiver are clocked to optimize the frequency plan. Still with this approach, given that the DC/DC converter duty cycle is a function of the ratio between Vin and Vout, it can be seen that the rising edge of the input signal to the DC/DC converter BOOST_LX changes as a function of the input and output voltages, as well as external losses (for example package, application, circuit board, etc.). The rising edges can hereby cause interference on the I-path and the Q-path (here termed CLK_SPL_I and CLK_SPL_Q, respectively) of the receiver path, especially during the sampling phases.

SUMMARY OF THE DISCLOSURE

There may be a need to provide a radio device, wherein interferences between a DC/DC converter and a receiver are avoided in an efficient and reliable manner.

A radio device, a method, and a method of using are provided.

According to an aspect of the present disclosure, it is described a radio device (e.g. an RFID/NFC device), comprising:
  i) a receiver (for receiving a radio signal, e.g. from an RFID/NFC tag);
  ii) a DC/DC converter (for converting a DC from a first voltage level to a DC of a second voltage level);
  iii) a clock device (e.g. a clock generator), configured to provide a synchronous clock to the receiver and the DC/DC converter (wherein the receiver clock has a receiver initial phase and the DC/DC converter clock has a DC/DC converter initial phase); and
  iv) a control device (e.g. a circuit or a plurality of circuits), configured to
     a) determine (measure) an information indicative of the DC/DC converter duty cycle (period), and
     b) adjust (calibrate) (or trigger adjusting) the initial phase of the DC/DC converter clock and/or the receiver clock based on said information (i.e. the determined duty cycle period).

According to a further aspect of the present disclosure, it is described a method (of operating a radio device), the method comprising:
  i) providing a synchronous clock to a DC/DC converter and a receiver of a radio device;
  ii) determining an information indicative of the DC/DC converter duty cycle; and
  iii) adjusting, based on said information, the initial phase of at least one of the DC/DC converter clock and the receiver clock (adjusting the phase shift).

According to a further aspect of the present disclosure, it is described a method of using a duty cycle measurement in a synchronized clock environment to adjust an initial phase of at least one of a receiver clock and a DC/DC converter clock, to thereby avoid an interference between the receiver and the DC/DC converter.

Figure 10:
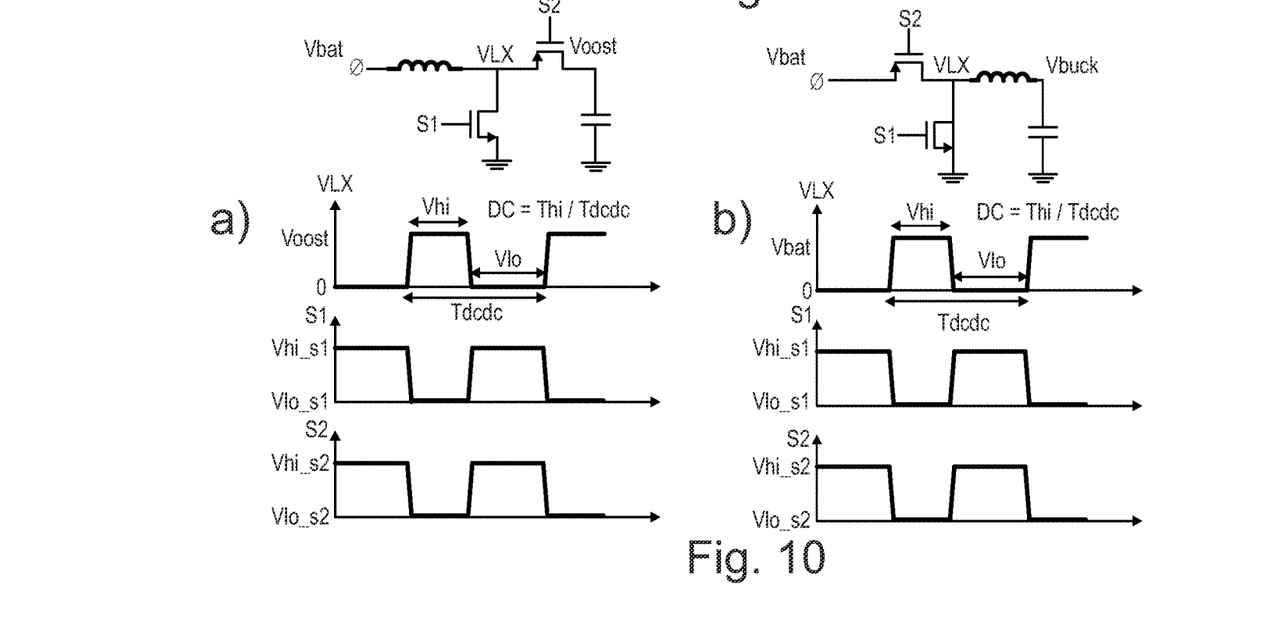
FIG. 10 illustrates DC/DC converters and corresponding duty cycles according to an exemplary embodiment of the present disclosure.

In the context of the present document, the term "duty cycle" may refer to a period in which a signal/system is active. For example, the duty cycle may be defined as the ratio between a pulse duration (pulse width) and the total period of the signal. The later can be the period between two rising (or two falling) edges (in case of a rectangular waveform). An example is shown in FIG. 10, wherein the duty cycle of the DC/DC converter is defined as Thi/Tdcdc.

In the context of the present document, the term "adjusting the initial phase" may refer to the circumstance that, even though the clocks of receiver and DC/DC converter are synchronized, the initial phases may be configured independently by respective phase shifter devices. Accordingly, the phases may be shifted based on the measured duty cycle of the DC/DC converter to thereby move/shift rising edges of the DC/DC converter away from sampling periods of the receiver. An equivalent way to describe adjustment of the initial phase would be looking at it in the time domain: the two signals have the same period, whereby it is desired to time-shift one relatively to the other, so that the edge of the DC/DC converter does not fall during specific instants of the receive path (for instance during sampling).

In the context of the present document, the term "control device" may refer to any hardware and/or software suitable to determine (an information regarding) the duty cycle of a DC/DC converter. Further, the control device may be suitable to adjust the initial phase of the DC/DC converter or of a receiver based on the determined duty cycle information. Hereby, the term "adjusting" may include that the control device triggers a phase shifter device to perform the actual phase shift adjustment. While in one example, the control device is a single device, in another example, the control device may comprise a plurality of devices. In an example, the control device is part of the DC/DC-converter/receiver IC, while in another example, the control device is arranged (at least partially) out-of-chip or even remote. In an example, the control device comprises one or more circuits. In a further example, the control device may be part of the CPU. In a specific example, the control device may use a finite state machine (FSM) algorithm to optimally configure the independent initial phases (transmitter, receiver, DC/DC converter), depending on the instantaneous measured DC/DC duty cycle, in such a way that the receiver samples at undisturbed instants. The FSM algorithm may be either purely based upon computation, or assisted by a LUT.

According to an exemplary embodiment, the invention may be based on the idea that interferences between a DC/DC converter and a receiver in a radio device may be avoided in an efficient and reliable manner, when an information regarding the duty cycle of the DC/DC converter is measured and is then used to calibrate the initial phase of the DC/DC converter clock and/or the receiver clock.

The disclosure may provide a means to make DC/DC converter and receiver coexist, in particular on the same die, with minimum impact on the receiver performance, by adequately locating the DC/DC converter moving edge outside of specific sensitive time periods (for instance receiver mixer sampling phases), thanks to the real-time knowledge of the DC/DC converter duty cycle through the integration of a control device that is configured as a duty cycle meter.

Thus, the described integrated calibration based on duty cycle measurement and a fully-synchronous system may configure a DC/DC converter in order to minimize interference toward a radio receiver.

The aspects defined above and further aspects of the disclosure are apparent from the examples of embodiment to be described hereinafter and are explained with reference to these examples of embodiment. The disclosure will be described in more detail hereinafter with reference to examples of embodiment but to which the disclosure is not limited.

EXEMPLARY EMBODIMENTS

According to an embodiment, the adjustment of the initial phase comprises: shifting (in the time domain) at least one of a rising edge event and a falling edge event (i.e. occurrence of a moving edge in the signal to the DC/DC converter) of the DC/DC converter clock away from a sampling event (in particular occurrence of a signal) of the receiver clock. Thereby, interferences may be efficiently avoided. It can be seen e.g. in FIGS. 3*b* and 4*b*, that, in comparison to FIGS. 3*a* and 4*a*, respectively, the moving edge of the DC/DC converter is moved/shifted away from the receiver signals. This adjustment of the DC/DC converter (alternatively receiver) initial phase may be based on the above described information regarding the DC/DC converter duty cycle.

According to a further embodiment, the radio device further comprises a transmitter, in particular coupled to the DC/DC converter. According to a further embodiment, the clock device is configured to provide the synchronous clock also to the transmitter. Thus, the transmitter may be included into he synchronized environment.

According to a further embodiment, the radio device further comprising: a phase shifter device, configured to provide the initial phase independently to at least one of the transmitter, the DC/DC converter, and the receiver. Hence, it may be enabled to adjust each initial phase separately to enable the shift of DC/DC converter moving edges away from receiver signals. The phase shifter device may comprise a subunit corresponding to each of the transmitter, the DC/DC converter, and the receiver. Further, the phase shifter device(s) may be (at least partially) controlled/regulated by the control device to adjust the initial phase according to the duty cycle information.

Figure 2:
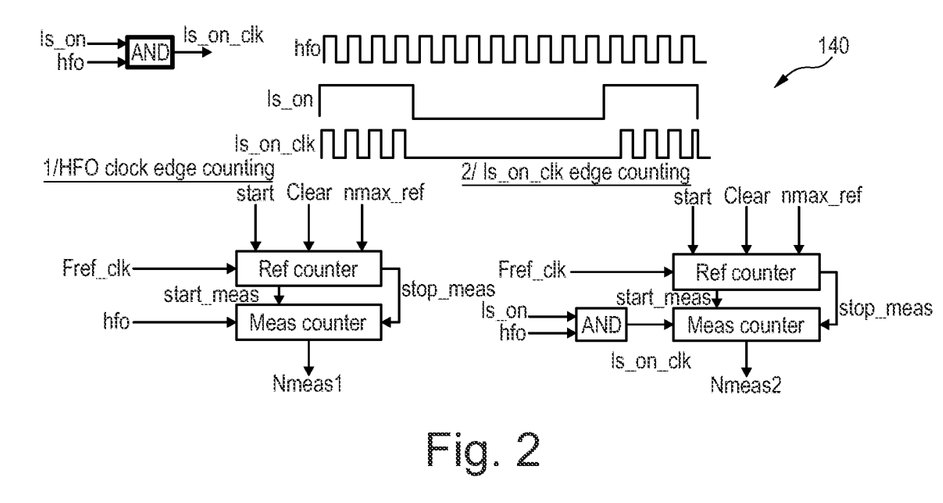
FIG. 2 illustrates a control device duty cycle measurement according to an exemplary embodiment of the present disclosure.

According to a further embodiment, the control device is configured to determine the information indicative of the DC/DC converter duty cycle by measuring at least one (in particular at least two) DC/DC converter reference (clock) signals. Referring to FIG. 2, there is illustrated an example of determining/measuring the duty cycle. It has turned out that such a measurement may be performed in a straightforward and reliable manner. Preferably, the accuracy of the measurement of the duty cycle is independent of the accuracy of the reference clock.

According to a further embodiment, the control device is configured to measure a first parameter (in particular the number of moving edges) of a first DC/DC converter reference signal (e.g. a clock signal), and measure a second parameter (in particular the number of moving edges) of a second DC/DC converter reference signal. In particular the second DC/DC converter reference signal is at least partially based on the first DC/DC converter reference signal.

In an example, the first DC/DC converter reference signal may be a high frequency oscillator (hfo) signal, generated by a reference clock device. The second DC/DC converter reference signal may be based on the combination of the first DC/DC converter reference signal with a further signal.

According to a further embodiment, the control device is configured to compare the first DC/DC converter reference signal with the second DC/DC converter reference signal to yield the information. For example, a first number of moving edges may be compared with a second number of moving edges. The HFO clock might be used in the DC/DC only for the duty cycle measurement. So, this signal might be used only for the duty cycle measurement, but not for the DC/DC core itself.

According to a further embodiment, the DC/DC converter is configured as a boost converter or a buck converter. Hence, the described approach may be directly implemented into established and widely used systems. FIG. 10 illustrates common configurations of such converters and their duty cycles.

According to a further embodiment, the second DC/DC converter reference signal is further based on a power control signal, in particular a transistor (gate) power control signal. The power control signal may be a (transistor, in particular a FET) power control signal of the DC/DC converter, for example S1 or S2 in FIG. 10.

According to a further embodiment, the radio device further comprising a phase-locked-loop (PLL) device coupled to the clock generator, so that the output of the PLL device is input to the clock generator. Thereby, the clock signal may be improved/regulated.

According to a further embodiment, the radio device further comprising a low-dropout (LDO) device, coupled between the transmitter and the DC/DC converter. Hereby, the DC/DC converter ripple may be at least partially reduced.

According to a further embodiment, the radio device further comprises a non-volatile memory, configured to store one or more look up tables (LUT). According to a further embodiment, one or more LUTs can be applied when performing the described method. Said LUT may contain the information and/or information regarding one or more adjusted/calibrated initial phase(s). In this manner, LUTs can be build based on the described determination and adjustment, so that a more efficient operation of the radio device may be enabled.

According to a further embodiment, at least one of the transmitter clock frequency, the receiver clock frequency, and the DC/DC generator clock frequency is 13.56 MHz or a multiple of 13.56 MHz. Accordingly, the present disclosure may be directly implemented into established RFID/NFC technology.

According to a further embodiment, the DC/DC converter and the receiver are arranged on the same integrated circuit (IC). Accordingly, the described concept can be realized on a small space with low manufacture cost. Even though an implementation on the same IC may cause interference between the DC/DC converter and the receiver in the prior art, these issues may be efficiently overcome by the described disclosure. The DC/DC converter and the receiver can be formed on a single die or single chip.

According to a further embodiment, the radio device is at least one of an RFID device and an NFC device. Thereby, economically important and standardized applications can be directly addressed. Due to the large difference in power levels and the limited space, the present disclosure may be especially suited for this application.

In the context of the present document, the term "RFID" (radio-frequency identification) may refer to a technique that uses electromagnetic fields (RF field) to communicate via short distances, in particular 10 meter or less. The term "RFID device" may refer to any device that has an RFID functionality. An RFID device may include an antenna and an integrated circuit with a transmitter and a receiver. A typical RFID system may include an RFID reader and one or more RFID tags which are associated to one or more objects. In an example, a first RFID device comprises a transmitter to transmit the RF signals to a second RFID device, and a receiver, to receive the modulated information of the second RFID device. The standard communication between RFID devices are specified in protocols.

In the context of the present document, the term "NFC" may refer to Near Field Communication which may be a short-range wireless technology (distances measured in centimeters). In order to make two NFC devices communicate, users may bring them close together or even make them touch. NFC may be considered as an established standard. In the present document, the NFC standard may be considered as a special form of RFID. In the context of the present document, the term "NFC device" may refer to any device that has an NFC functionality as described above. An NFC functionality may for example be implemented in a tag, a smart card, a card reader, or a mobile phone.

DETAILED DESCRIPTION OF THE DRAWINGS

Before referring to the drawings, embodiments will be described in further detail, some basic considerations will be summarized based on which embodiments of the disclosure have been developed.

According to an exemplary embodiment, the disclosure may comprise at least one of the following aspects:
 i) having a fully synchronous system comprising: receiver, transmitter, DC/DC converter,
 ii) with independent adjustable phase shifts,
 iii) having embedded a duty-cycle meter to determine the instants of the DC/DC converter rising/falling edge. The duty cycle meter accuracy is preferably insensitive to the accuracy of the reference clock. The duty cycle meter allows accurate estimation of the DC/DC converter edges instants, iv) having embedded an algorithm (either hardware (HW) or firmware (FW) FSM) which characterizes the DC/DC duty cycle and the receiver output noise versus the DC/DC input and output voltage, v) building a compact LUT, which is stored in non-volatile memory, vi) using the integrated duty-cycle meter to select the optimum initial phases for the DC/DC converter and receiver sampling clock during normal operation.

Figure 1:
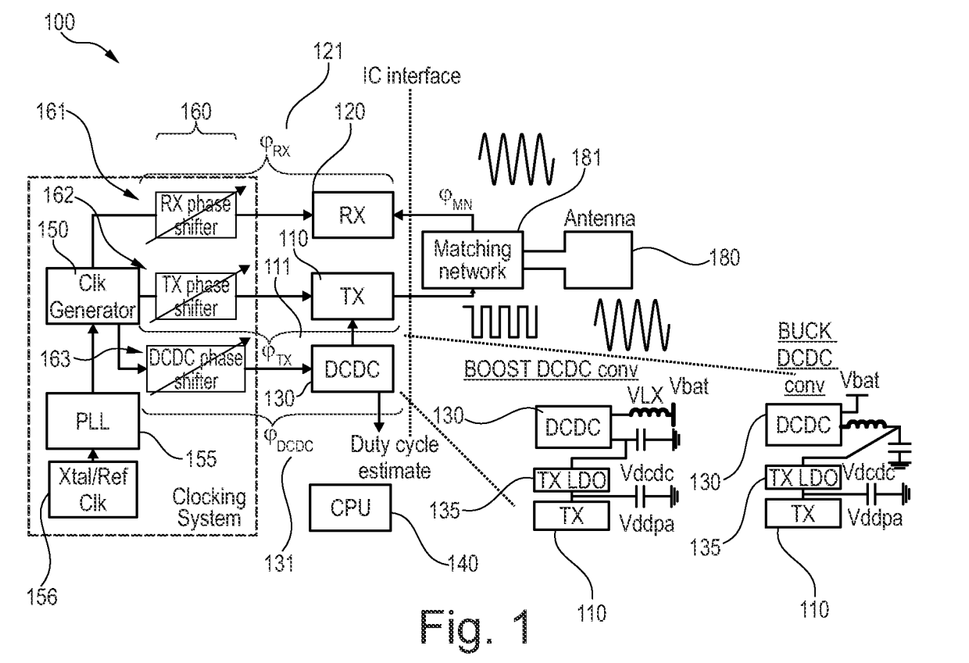
FIG. 1 illustrates a radio device according to an exemplary embodiment of the present disclosure.

FIG. 1 shows a radio device 100 according to an exemplary embodiment of the present disclosure. The radio device 100 comprises an integrated circuit (IC) with a transmitter 110, a receiver 120, and a DC/DC converter 130. Further, the integrated circuit comprises a clock device 150 that is coupled to each of the transmitter 110, the receiver 120, and the DC/DC converter 130, and is configured to provide a synchronous clock to the transmitter 110, the receiver 120, and the DC/DC converter 130.

Even though a synchronous clock signal is applied, the (initial) phases of the transmitter 110, the receiver 120, and the DC/DC converter 130 are independently adjustable. This is realized by a phase shifter device 160 that comprises in this example three subunits: i) a receiver phase shifter device 161, configured to adjust the initial phase 121 of the receiver 120, ii) a transmitter phase shifter device 162, configured to adjust the initial phase 111 of the transmitter 110, and iii) a DC/DC converter phase shifter device 163, configured to adjust the initial phase 131 of the DC/DC converter device 130. The phase shifter devices 161, 162, 163 are respectively coupled between the clock device 150 and the receiver 120, the transmitter 110, and the DC/DC converter 130.

Outside of the integrated circuit, there is arranged an antenna 180 that is connected to the transmitter 110 and the receiver 120 via a matching network 181. The antenna 180 is thus configured to transmit electromagnetic waves from the transmitter 110 and to send received electromagnetic waves to the receiver 120.

In this example, the radio device 100 is configured as an NFC reader device (e.g. of a smartphone) that can interact with a passive NFC tag. As a consequence, the DC/DC converter 130 has to provide a high voltage to the transmitter 110 (so that the NFC tag can be powered), while the receiver 120 obtains only a very low voltage from the NFC tag. As discussed above, since receiver 120 and DC/DC converter 130 are arranged on the same IC, there may occur interferences between the low-power receiver 120 and the high-power DC/DC converter 130.

To overcome this issue, the radio device 100 comprises a control device 140, illustrated in this example as a CPU coupled to the DC/DC converter 130. The control device 140 is configured to determine an information indicative of the DC/DC converter 130 duty cycle (see FIG. 2 for details). Further, the control device 140 is configured to adjust, based on said information, the initial phase of the DC/DC converter 130 clock and/or the receiver 120 clock. The actual phase shift can be done by the respective phase shifter subunit 161, 163, triggered by the control unit 140.

It is further shown schematically a clocking system that includes the phase shifter device 160 and the clock device 150. Further, within the clocking system, a PLL device 155 is coupled to the clock device 150, so that the output of the PLL 155 is input to the clock device 150. Additionally, the clocking system comprises a reference clock device 156 coupled to the PLL 155.

Furthermore, it is illustrated that the DC/DC converter 130 can be designed either as a boost converter or a buck converter. In both examples, a (transmitter) LDO device 135 can be coupled between DC/DC converter 130 and transmitter 110, to reduce the ripple of the DCDC converter 130.

A specific exemplary embodiment can be described as follows: transmitter, receiver, and DC/DC converter clocks are generated from the common clocking system and are in this way made synchronous, yet having independently configurable initial phases. The clock device 150 is here a digital block which provides a clock to receiver, transmitter, and DC/DC converter, using the PLL device 155 output(s) as input (multi-phase) clock(s). The transmitter 110 clock frequency can be multiple of 13.56 MHz, with large oversampling factor providing a phase configurability in the order of one or few degrees. The receiver clock frequency can be multiple of 13.56 MHz, configurable in units of 8×13.56 MHz clock cycles. The DC/DC converter clock frequency can be 2×13.56 MHz/7=3.87 MHz, configurable in units of 8× or 16×13.56 MHz clock cycles.

FIG. 2 illustrates a control device 140 to perform a duty cycle measurement according to an exemplary embodiment of the present disclosure. In this example, there are provided a first DC/DC converter reference clock signal, here hfo, and a power control signal, here ls_on. An AND combination of these signals yields a second DC/DC converter reference clock signal, here ls_on_clk.

HFO can be an independent oscillator, so called free-running, since not regulated by a PLL loop. Since the described technique of the duty cycle meter may be not sensitive to the quality of the clock, there can be no need for a PLL to control the oscillator/HFO.

The control device 140 now measures a first parameter, being the number of rising edges here, of the first DC/DC converter reference clock signal hfo, yielding a first number Nmeas1. Further, the control device 140 measures a second parameter, being the number of rising edges here, of the second DC/DC converter reference signal ls_on_clk, yielding a second number Nmeas2. A comparison of these two numbers, e.g. Nmeas1/Nmeas2, can yield the information regarding the duty cycle.

A specific example is described in the following. The duty cycle measurement applies a power field effect transistor (FET) control signal ("ls_on") and measures the DC/DC converter duty cycle in a two-step manner using a frequency meter in the following way:

i) in a first step, the number of rising edges (Nmeas1) of a hfo (high-frequency oscillator) is measured across an accurately-defined time measurement period. The accurately-defined time measurement period is realized in this example by clock signal Fref_clk to count a predefined number of cycles.

ii) in a second step, the number of rising edges (Nmeas2) of the signal resulting from a AND combination between the power FET control signal (ls_on) and the hfo clock is measured across the same accurately-defined time measurement period (see above).

iii) the DC/DC converter duty cycle is computed as DC=Nmeas2/Nmeas1. The two-step approach of the duty-cycle meter makes it very robust against reference clock frequency accuracy. This control sequence may be executed by a hardware (HW) FSM or a firmware (FW) FSM algorithm.

Figure 3:
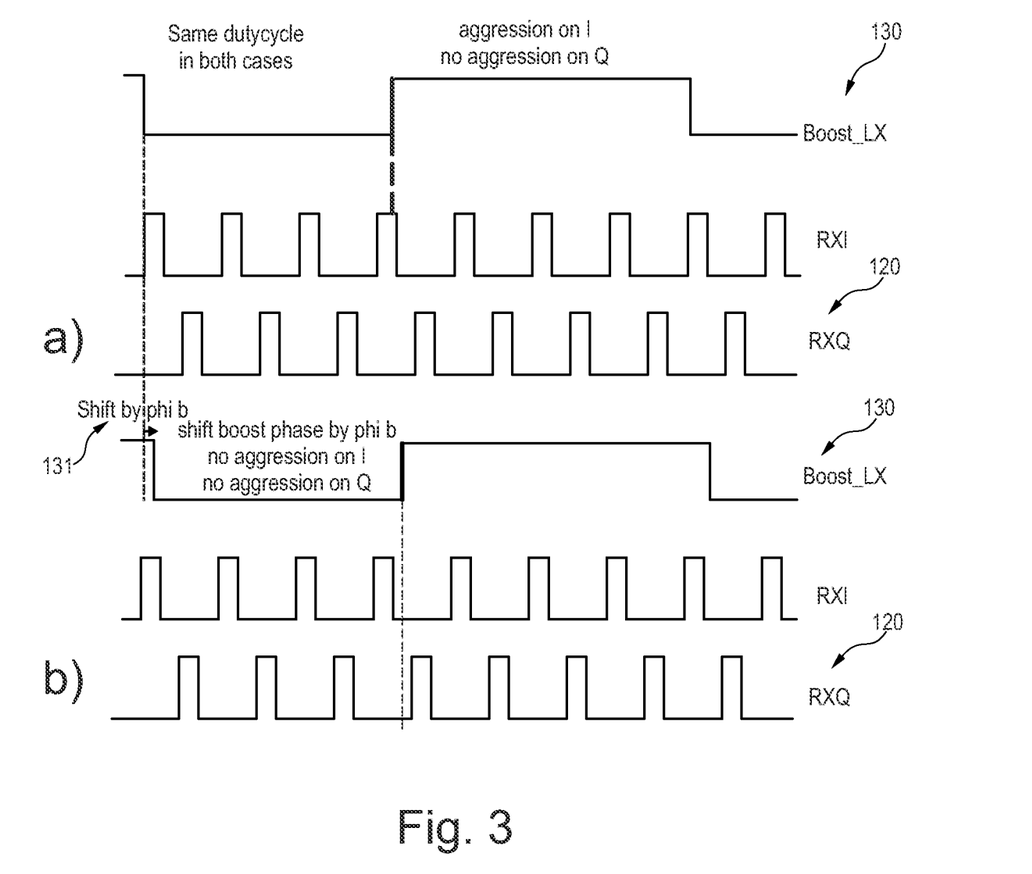
FIG. 3 illustrates an adjustment of the initial phase of the DC/DC converter according to an exemplary embodiment of the present disclosure.

FIG. 3 illustrates an adjustment of the initial phase 131 of the DC/DC converter 130 according to an exemplary embodiment of the present disclosure.

Figure 5:
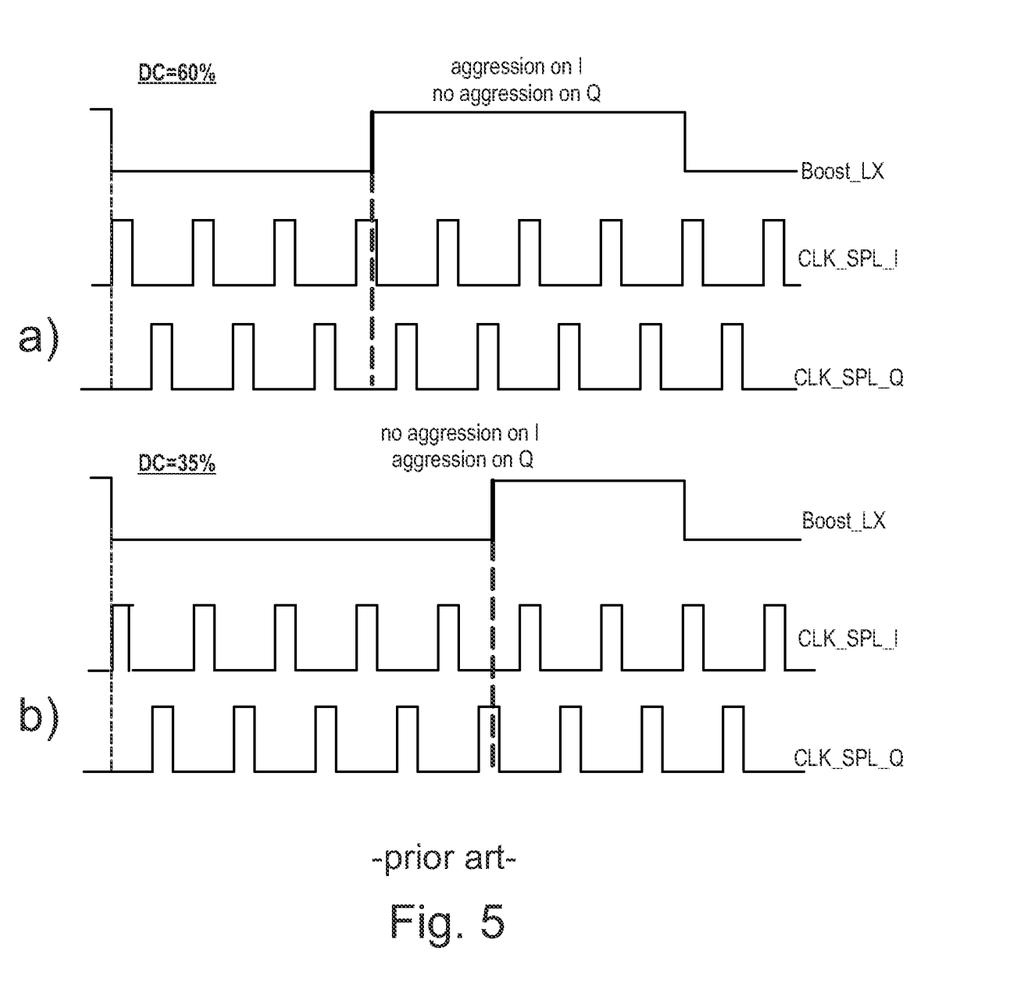
FIG. 5 illustrates interference between DC/DC converter and receiver in a conventional device.

FIG. 3a: without adjustment of the DC/DC converter initial phase 131, there will be an interference between the DC/DC converter 130 rising edge and the receiver signal during the sampling period (here on the I-path), see also FIG. 5.

FIG. 3b: adjustment of the DC/DC converter initial phase 131, based on the information regarding the duty cycle, however, shifts the DC/DC converter rising edge away from the receiver sampling period.

Figure 4:
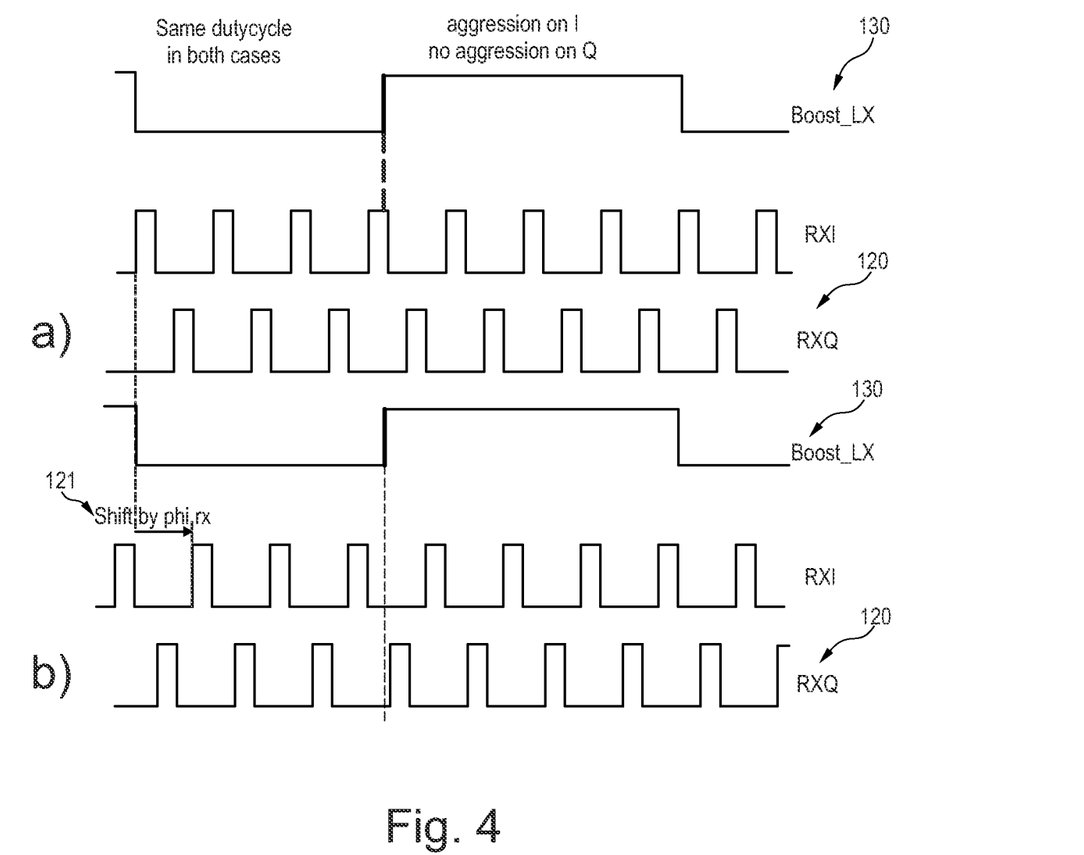
FIG. 4 illustrates an adjustment of the initial phase of the receiver according to an exemplary embodiment of the present disclosure.

FIG. 4 illustrates an adjustment of the initial phase 121 of the receiver 120 according to an exemplary embodiment of the present disclosure. The example of FIG. 4 is comparable to FIG. 3 with the difference being that the receiver initial phase 121 is adjusted. The adjustment of the receiver sampling initial phase leads to the avoidance of interference injected from DC/DC converter to the receiver path.

Figure 6:
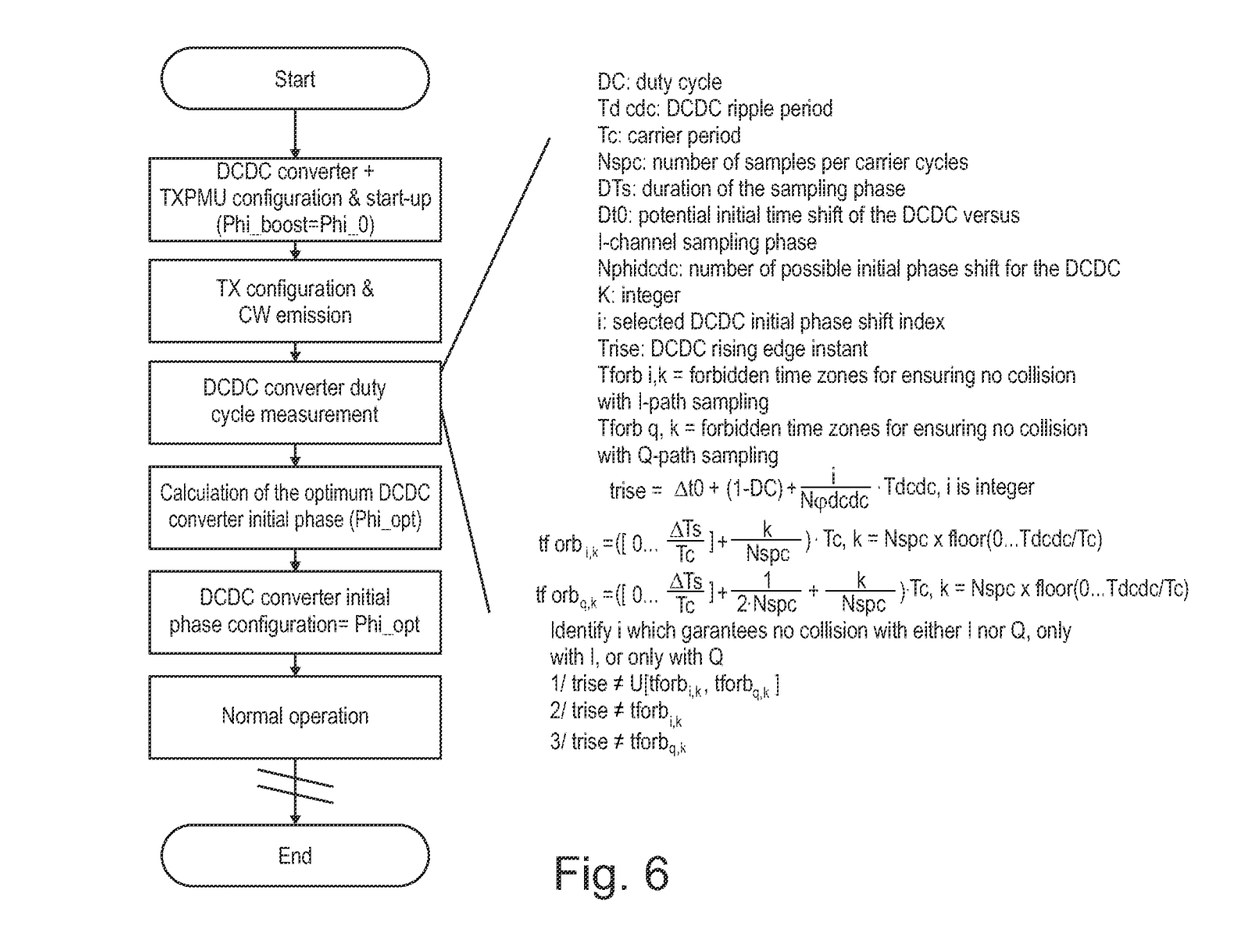
FIG. 6 illustrates a flowchart of a method according to an exemplary embodiment of the present disclosure.

FIG. 6 illustrates a flowchart of a method according to an exemplary embodiment of the present disclosure. In a first usage of the duty cycle measurement of the control device 140, the DC/DC converter optimum initial phase 131 is calculated from the DC/DC converter duty cycle either with a FW FSM or a HW FSM.

Figure 7:
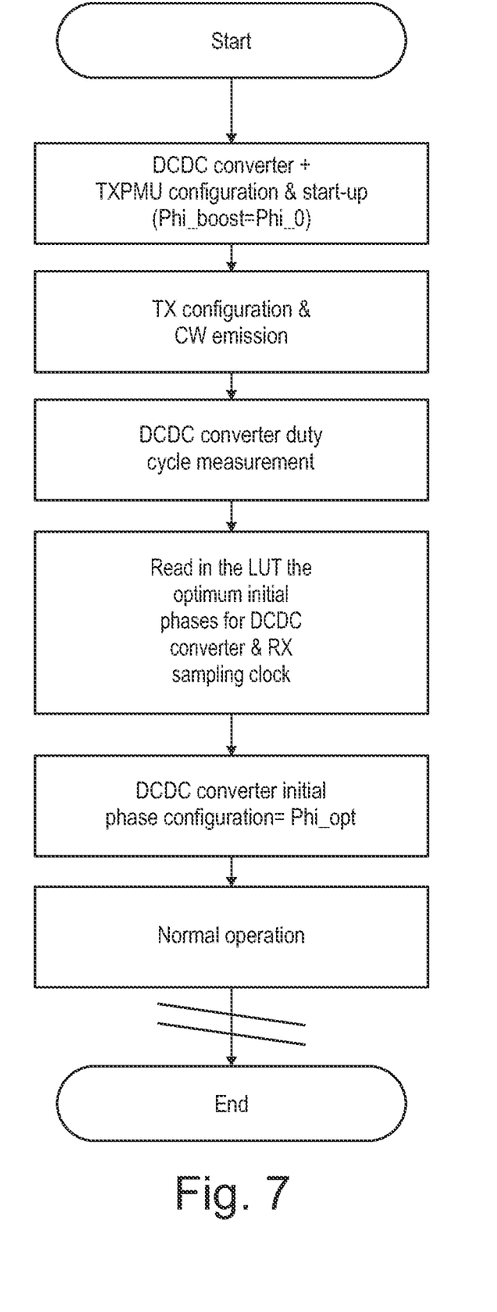
FIGS. 7 and 8 respectively illustrate a flowchart of a method using look-up tables according to an exemplary embodiment of the present disclosure.

FIG. 7 illustrates a flowchart of a method using look-up tables according to an exemplary embodiment of the present disclosure. FIG. 7 describes the usage of the duty cycle meter and the LUT during normal operation which allows an optimum configuration of the DC/DC converter and receiver sampling initial phases. The operation is detailed with the setting of the optimum DC/DC converter and receiver sampling initial phases at start-up. This can be done continuously or from time to time, instead of at start-up only, following exactly the same principle. State-machine can be used for the DC/DC converter LUT during normal operation.

Figure 8:
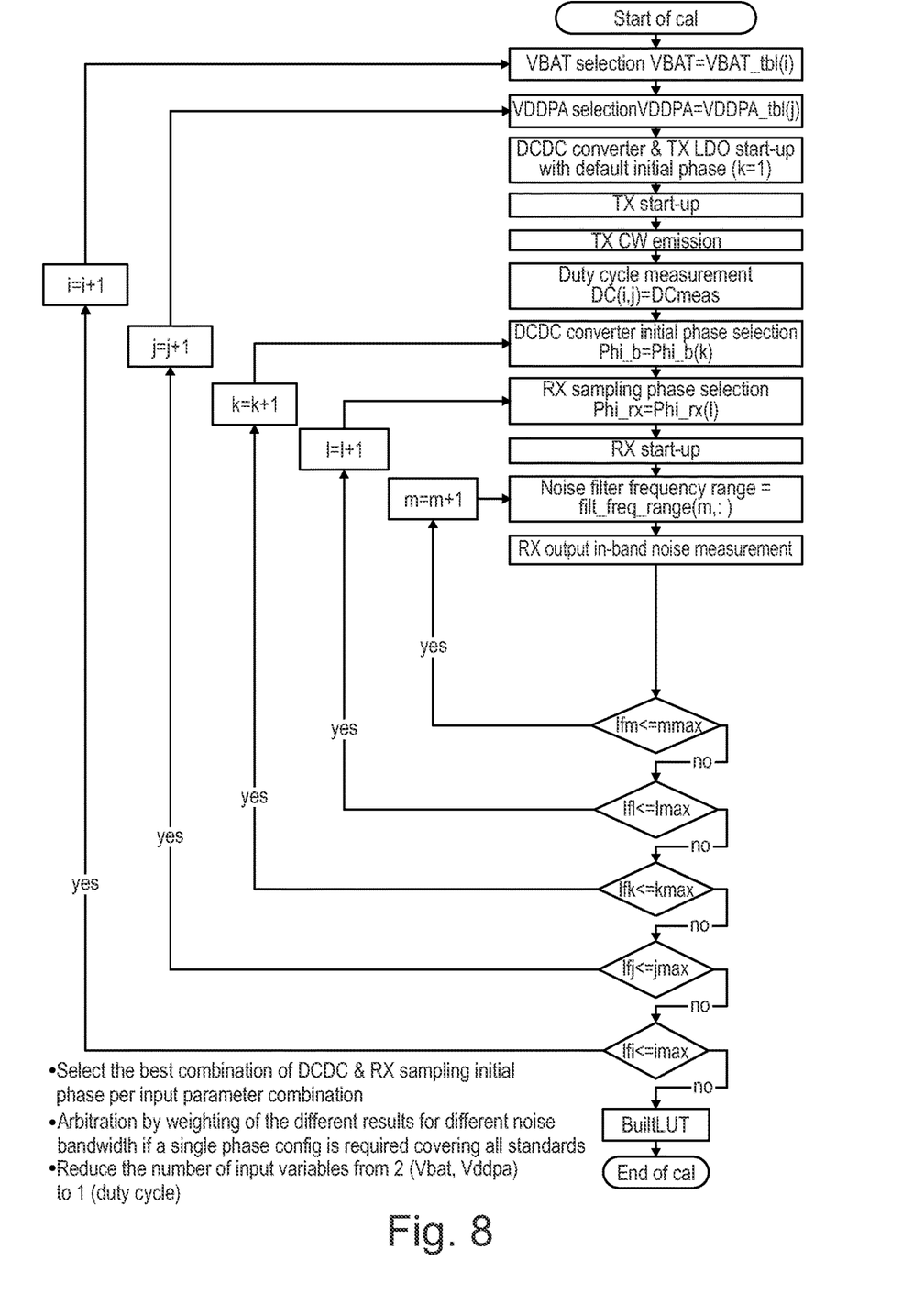

FIG. 8 illustrates a flowchart of a method using look-up tables according to an exemplary embodiment of the present disclosure. The LUT stores the optimum initial phases for the DC/DC converter and receiver sampling as a function of the DC/DC converter duty cycle. For building the LUT, the input and output voltages of the DC/DC converter are swept, while the DC/DC converter duty cycle is being measured and the receiver output noise is being measured for several DC/DC converter initial phase values, several receiver sampling phase settings, and potentially for several frequency ranges for the receiver output noise analysis, if the receiver is multi-standard. After execution of the algorithm shown in FIG. 7, the resulting LUT contains:

i) Input 1: DC/DC duty cycle,
ii) Input 2 (optional): standard index/frequency range index,
iii) Output 1: DC/DC converter initial phase (Phi_b),
iv) Output 2: receiver sampling phase (Phi_rx).

Figure 9:
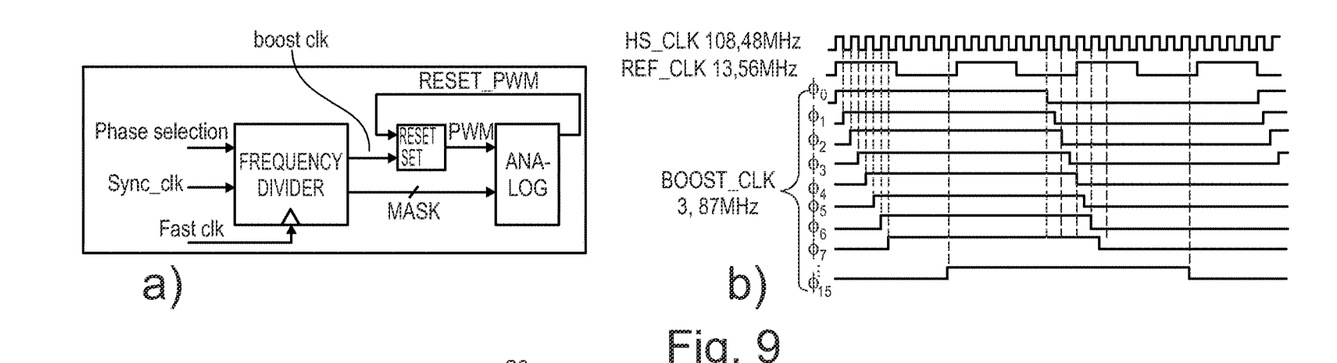
FIG. 9 illustrates a frequency divider according to an exemplary embodiment of the present disclosure.

FIG. 9 illustrates a frequency divider according to an exemplary embodiment of the present disclosure. FIG. 9 shows how the programmable phase shift on the DC/DC converter can be designed, by a frequency divider using a high-speed clock and a synchronization clock, both generated in the central clock generator. In the example of FIG. 9, rising and falling edges of the high-speed clock are used. Alternative implementation could use rising edges only. The DC/DC converter phase shifter and the DC/DC converter block diagram are shown on the left side, while the clock waveforms are shown on the right side.

FIG. 10 illustrates DC/DC converters and corresponding duty cycles according to an exemplary embodiment of the present disclosure. In case of boost (FIG. 10a) and buck (FIG. 10b) converters, the power control signals (S1 and S2) have a duty cycle which is either complementary to the DC/DC converter duty cycle (DC_S1=DC_S2=1−DC_DCDC) or equal to the DC/DC converter duty cycle (schematically shown with series PMOS power FET replaced by NMOS power switch, DC_S1=DC_S2=DC_DCDC).

REFERENCE SIGNS

100 Radio device
110 Transmitter
111 Transmitter initial phase
120 Receiver
121 Receiver initial phase
130 DC/DC converter
131 DC/DC converter initial phase
135 LDO device
140 Control device
150 Clock device, clock generator
155 PLL device
156 Reference clock device
160 Phase shifter device, general
161 Phase shifter device receiver
162 Phase shifter device transmitter
163 Phase shifter device DC/DC converter
180 Antenna
181 Matching circuit

The invention claimed is:

1. A radio device, comprising:
a receiver;
a DC/DC converter;
a clock device, configured to provide clock signals to the receiver and the DC/DC converter; and
a control device, configured to
determine an information indicative of a duty cycle of the DC/DC converter, and
adjust, based on said information, an initial phase of at least one of the clock signals provided to the DC/DC converter and the receiver;
wherein the adjust of the initial phase includes shifting at least one of a rising edge event and a falling edge event of the clock signals provided to the DC/DC converter away from the clock signals provided to the receiver for a sampling event on a received signal.

2. The radio device according to claim 1,
further comprising a transmitter, coupled to the DC/DC converter, wherein the clock device is configured to provide the clock signals to the transmitter.

3. The radio device according to claim 2,
further comprising a phase shifter device, configured to provide the initial phase to at least one of the transmitter, the DC/DC converter, and the receiver.

4. The radio device according to claim 1,
wherein the control device is configured to determine the information indicative of the duty cycle of the DC/DC converter by measuring at least one DC/DC converter reference signal.

5. The radio device according to claim 4,
wherein the control device is configured to measure a first parameter of a first DC/DC converter reference signal, measure a second parameter of a second DC/DC converter reference signal, and compare the first DC/DC converter reference signal with the second DC/DC converter reference signal to yield the information.

6. The radio device according to claim 5,
wherein the second DC/DC converter reference signal is at least partially based on the first DC/DC converter reference signal.
7. The radio device according to claim 5,
wherein the second DC/DC converter reference signal is further based on a power control signal.
8. The radio device according to claim 1,
wherein the DC/DC converter is configured as a boost converter or a buck converter.
9. The radio device according to claim 1,
further comprising a phase-locked-loop (PLL) device coupled to the clock generator, so that output from the PLL device is input to the clock generator.
10. The radio device according to claim 1,
further comprising a low-dropout (LDO) device, coupled between the transmitter and the DC/DC converter.
11. The radio device according to claim 1,
further comprising a non-volatile memory, configured to store one or more look up tables (LUT).
12. The radio device according to claim 11,
wherein the one or more LUTs contain at least one of the information and the adjust of the initial phase.
13. The radio device according to claim 1,
wherein at least one of a transmitter clock frequency, a receiver clock frequency, and a DC/DC generator clock frequency is 13.56 MHz or a multiple of 13.56 MHz.
14. The radio device according to claim 1,
wherein the DC/DC converter and the receiver are arranged on the same integrated circuit (IC).
15. The radio device according to claim 1,
wherein the radio device is at least one of an RFID device and an NFC device.
16. The radio device according to claim 1,
wherein the adjust of the initial phase includes shifting at least one of the rising edge event and the falling edge event of the clock signals provided to the DC/DC converter or the receiver to avoid interference injected from the DC/DC converter into a receiver path for sampling the received signal.

17. A method, comprising:
providing clock signals to a DC/DC converter and a receiver of a radio device;
determining an information indicative of a duty cycle of the DC/DC converter;
adjusting, based on said information, an initial phase of at least one of the clock signals provided to the DC/DC converter and the receiver; and
shifting at least one moving edge event of the clock signals provided to the DC/DC converter away from the clock signals provided to the receiver for a sampling event on a received signal by the receiver.
18. The method according to claim 17,
further comprising measuring the information indicative of the duty cycle of the DC/DC converter based on one or more DC/DC converter reference signals.
19. A radio device, comprising:
a receiver;
a DC/DC converter;
a clock device, configured to provide clock signals to the receiver and the DC/DC converter; and
a control device, configured to
determine an information indicative of a duty cycle of the DC/DC converter, and
adjust, based on said information, an initial phase of at least one of the clock signals provided to the DC/DC converter and the receiver;
wherein the control device is configured to determine the information indicative of the duty cycle of the DC/DC converter by measuring at least one DC/DC converter reference signal; and
wherein the control device is configured to measure a first parameter of a first DC/DC converter reference signal, measure a second parameter of a second DC/DC converter reference signal, and compare the first DC/DC converter reference signal with the second DC/DC converter reference signal to yield the information.

* * * * *